(12) United States Patent
Harada et al.

(10) Patent No.: US 11,729,907 B2
(45) Date of Patent: Aug. 15, 2023

(54) STRUCTURE AND CIRCUIT BOARD

(71) Applicant: KABUSHIKI KAISHA TOSHIBA, Tokyo (JP)

(72) Inventors: Koichi Harada, Bunkyo (JP); Yasuhiro Goto, Minato (JP); Kenji Essaki, Kawasaki (JP); Yasushi Hattori, Kawasaki (JP); Maki Yonetsu, Mitaka (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/168,458

(22) Filed: Feb. 5, 2021

(65) Prior Publication Data

US 2021/0161007 A1 May 27, 2021

Related U.S. Application Data

(63) Continuation of application No. PCT/JP2020/009075, filed on Mar. 4, 2020.

(30) Foreign Application Priority Data

Sep. 18, 2019 (JP) ................. 2019-168946

(51) Int. Cl.
*H05K 1/03* (2006.01)
*C04B 35/584* (2006.01)
*H01L 23/15* (2006.01)

(52) U.S. Cl.
CPC ......... *H05K 1/0306* (2013.01); *C04B 35/584* (2013.01); *H01L 23/15* (2013.01)

(58) Field of Classification Search
CPC ..... H01L 23/15; C04B 35/584; H05K 1/0306; H05K 1/03

(Continued)

(56) References Cited

U.S. PATENT DOCUMENTS 4,180,410 A * 12/1979 Masaki ................ C04B 35/584
501/97.2
4,643,858 A 2/1987 Mizutani
(Continued)

FOREIGN PATENT DOCUMENTS

JP 57-200266 A 12/1982
JP 58-43627 A 3/1983
(Continued)

OTHER PUBLICATIONS

International Search Report dated May 27, 2020 PCT/JP2020/009075 filed Mar. 4, 2020, 5 pages.
(Continued)

*Primary Examiner* — Tremesha S Willis
(74) *Attorney, Agent, or Firm* — Oblon, McClelland, Maier & Neustadt, L.L.P.

(57) ABSTRACT

A structure according to the embodiment includes a first crystal grain, a second crystal grain, and a first region. The first crystal grain includes silicon nitride. The second crystal grain includes a first element selected from a first group consisting of scandium, yttrium, lanthanum, cerium, praseodymium, neodymium, promethium, samarium, europium, gadolinium, terbium, dysprosium, holmium, erbium, thulium, ytterbium, lutetium, aluminum, chromium, zirconium, magnesium, zinc, titanium, gallium, beryllium, calcium, strontium, barium, hafnium, vanadium, niobium, tantalum, tungsten, iron, cobalt, nickel, and copper, and oxygen. The first region includes an oxide of the first element.

22 Claims, 5 Drawing Sheets

(58) Field of Classification Search
USPC .......................................................... 174/258
See application file for complete search history.

(56) References Cited

U.S. PATENT DOCUMENTS

| | | | |
|---|---|---|---|
| 5,523,268 A | 6/1996 | Ukyo et al. | |
| 2004/0140596 A1 | 7/2004 | Satoh et al. | |
| 2007/0264576 A1 | 11/2007 | Jorge et al. | |
| 2008/0234122 A1 | 9/2008 | Jorge et al. | |
| 2018/0310402 A1* | 10/2018 | Kirikihira | C04B 35/14 |

FOREIGN PATENT DOCUMENTS

| | | |
|---|---|---|
| JP | 59-199583 A | 11/1984 |
| JP | 59-207874 A | 11/1984 |
| JP | 59-207876 A | 11/1984 |
| JP | 63-103872 A | 5/1988 |
| JP | 5-69790 B2 | 10/1993 |
| JP | 7-232964 A | 9/1995 |
| JP | 8-290971 A | 11/1996 |
| JP | 2000-335976 A | 12/2000 |
| JP | 1 443 030 A2 | 8/2004 |
| JP | 1 443 030 A3 | 8/2004 |
| JP | 2011-514303 A | 5/2011 |
| JP | 2018-184337 A | 11/2018 |

OTHER PUBLICATIONS

Written Opinion dated May 27, 2020 in PCT/JP2020/009075 filed Mar. 4, 2020, 6 pages.
Hirosaki, N. et al., "Effect of Grain Growth on the Thermal Conductivity of Silicon," Journal of the Ceramic Society of Japan, vol. 104, No. 1, 1996 (with English Translation), 18 pages.
Zhou, Y. et al., "A Tough Silicon Nitride Ceramic with High Thermal Conductivity," Advanced Materials, vol. 23, No. 39, Oct. 18, 2011, XP055695709, 5 pages.

* cited by examiner

STRUCTURE AND CIRCUIT BOARD

CROSS-REFERENCE TO RELATED APPLICATIONS

This is a continuation application of International Patent Application PCT/JP2020/009075, filed on Mar. 4, 2020. This application also claims priority to Japanese Patent Application No. 2019-168946, filed on Sep. 18, 2019. The entire contents of which are incorporated herein by reference.

FIELD

Embodiments described herein relate generally to a structure and a circuit board.

BACKGROUND

There is a need to improve reliability for a structure including silicon nitride.

DETAILED DESCRIPTION

According to one embodiment, a structure includes a first crystal grain, a second crystal grain, and a first region. The first crystal grain includes silicon nitride. The second crystal grain includes a first element selected from a first group consisting of scandium, yttrium, lanthanum, cerium, praseodymium, neodymium, promethium, samarium, europium, gadolinium, terbium, dysprosium, holmium, erbium, thulium, ytterbium, lutetium, aluminum, chromium, zirconium, magnesium, zinc, titanium, gallium, beryllium, calcium, strontium, barium, hafnium, vanadium, niobium, tantalum, tungsten, iron, cobalt, nickel, and copper, and oxygen. The first region includes an oxide of the first element.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

Figure 1A:
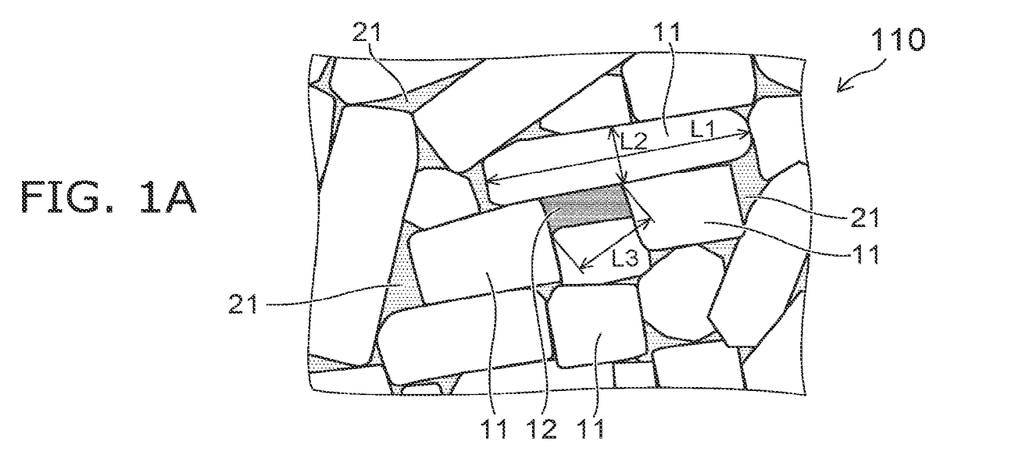
FIGS. 1A to 1C are schematic cross-sectional views illustrating a structure according to an embodiment.
Figure 1B:
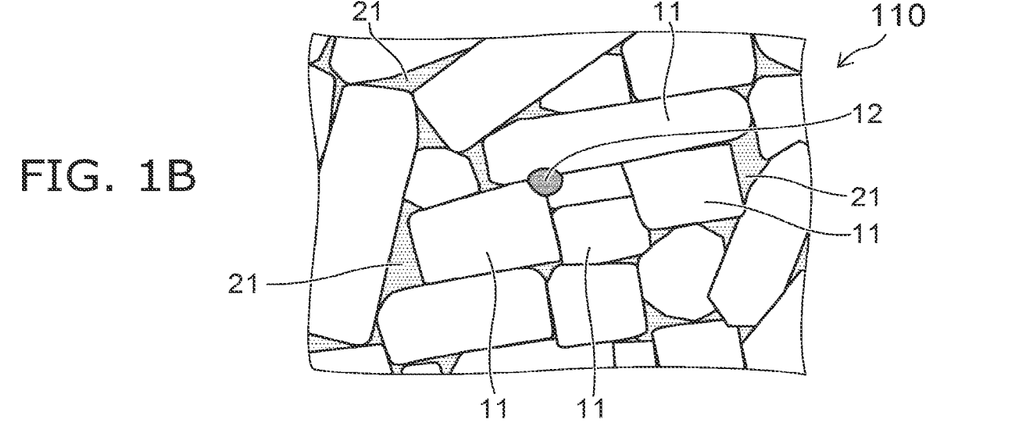
Figure 1C:
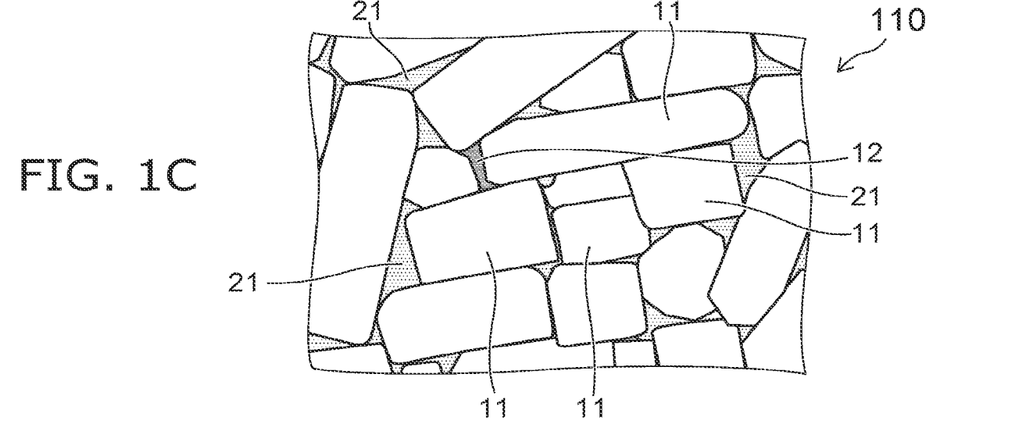

FIGS. 1A to 1C are schematic cross-sectional views illustrating the structure according to the embodiment.

A structure 110 according to the embodiment includes first crystal grains 11, a second crystal grain 12, and first regions 21, as illustrated in FIGS. 1A to 1C.

The first crystal grains 11 include crystalline silicon nitride. The second crystal grain 12 is provided in the first crystal grains 11. The second crystal grain 12 includes the first element selected from the first group consisting of scandium, yttrium, lanthanum, cerium, praseodymium, neodymium, promethium, samarium, europium, gadolinium, terbium, dysprosium, holmium, erbium, thulium, ytterbium, lutetium, aluminum, chromium, zirconium, magnesium, zinc, titanium, gallium, beryllium, calcium, strontium, barium, hafnium, vanadium, niobium, tantalum, tungsten, iron, cobalt, nickel, and copper, and oxygen. For example, the second crystal grain 12 includes a crystal of an oxide of the first element.

A plurality of the first crystal grains 11 are provided. The plurality of the first crystal grains 11 are provided around the second crystal grain 12. For example, the second crystal grain 12 is surrounded by the plurality of the first crystal grains 11. The second crystal grain 12 is positioned between one first crystal grain 11 and another first crystal grain 11. For example, at least a part of the second crystal grain 12 contacts at least one of the one first crystal grain 11 and the other first crystal grain 11. It is favorable that the second crystal grain 12 is surrounded by the first crystal grains 11 or is in contact with the first crystal grains 11, because the second crystal grain 12 can reduce strain generated in the first crystal grains 11.

Also, for example, at least a part of crystal lattices of the second crystal grain 12 conforms to at least a part of crystal lattices of the one first crystal grain 11 and at least a part of crystal lattices of the other first crystal grain 11. A composition of the first crystal grain 11 is represented by a general formula $Si_3N_{4\pm x}$ ($0 \leq x \leq 0.1$), for example. In addition, at least one element selected from the group consisting of Al and O may be included inside the crystal lattice of the first crystal grain 11.

For example, a crystalline structure of the first crystal grain 11 is a hexagonal crystal. For example, when the second crystal grain 12 includes yttrium, the crystalline structure of the second crystal grain 12 is a cubical crystal.

The first region 21 is provided between the first crystal grains 11. The first region 21 may be provided between at least one of the plurality of the first crystal grains 11 and the second crystal grain 12. The first region 21 is amorphous. The first region 21 may include a crystalline phase. That is, the first region 21 may only include an amorphous phase, or may include both an amorphous phase and a crystalline phase. When the first region 21 includes a crystalline phase, a composition of the crystalline phase is different from a composition of the second crystal grain. The first region 21 includes an oxide of the first element.

A shape of each of the first crystal grains 11 and the second crystal grain 12 may vary depending on the cross-sections, as illustrated in FIGS. 1A to 1C. The shape of each of the first crystal grains 11 and the second crystal grain 12 may be arbitrary, like circular, elliptical, substantially square, substantially triangular, or the like.

Including the second crystal grain 12 in the structure 110 can improve thermal shock resistance of the structure 110. As a result, it is possible to improve reliability of the structure 110.

For example, a volume percentage of one second crystal grain 12 in the structure 110 is not smaller than 0.0001 vol % and not larger than 5 vol %. Favorably, the volume percentage is not smaller than 0.0001 vol % and not larger than 1 vol %. It is favorable that the volume percentage is within the range because the thermal shock resistance can be improved while flexural strength and thermal conductivity are maintained. Preferably, the volume percentage is not smaller than 0.0001 vol % and not larger than 0.5 vol %. It is preferable that the volume percentage is within the range, because the thermal shock resistance can be improved while the flexural strength and the thermal conductivity are highly maintained.

An oxygen concentration in at least one of the plurality of the first crystal grains 11 is higher than 0 wt % and not higher than 0.1 wt %. Favorably, the oxygen concentration is higher than 0 wt % and not higher than 0.01 wt %. It is favorable that the oxygen concentration is within the range because the thermal conductivity can be improved. Preferably, the oxygen concentration is higher than 0 wt % and not higher than 0.005 wt %. It is preferable that the oxygen concentration is within the range, because the thermal conductivity can be further improved.

A ratio of an average of minimum diameters of the plurality of the first crystal grains 11 with respect to an average of maximum diameters of the plurality of the first crystal grains 11 is larger than 0 and not larger than 0.1 in one cross-section of the structure 110. A ratio of a maximum diameter of the second crystal grain 12 with respect to the average of the maximum diameters of the plurality of the first crystal grains is larger than 0.001 and not larger than 0.5. The maximum diameter is a length of the longest line segment among a plurality of line segments obtained by joining any two points on an outer edge of one crystal grain in the one cross-section. The minimum diameter is a length of a line segment passing through a center of the longest line segment and being perpendicular to the longest line segment among the plurality of the line segments. FIG. 1A illustrates, by way of example, the maximum diameter L1 of one first crystal grain 11, the minimum diameter L2 of the one first crystal grain 11, and the maximum diameter of the second crystal grain 12.

FIGS. 2A and 2B, FIGS. 3A and 3B, and FIGS. 4A and 4B are schematic views illustrating another structure according to the embodiment.

Figure 2A:
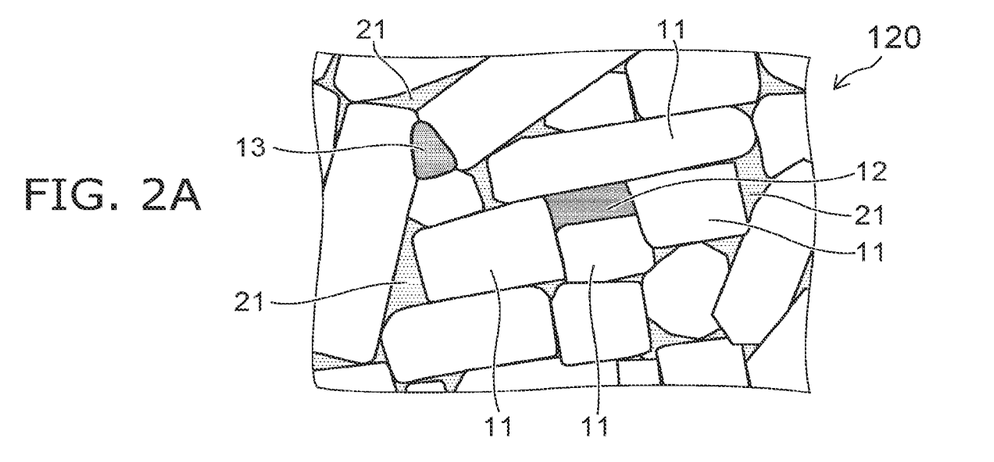
FIGS. 2A and 2B are schematic cross-sectional views illustrating another structure according to the embodiment.
Figure 2B:
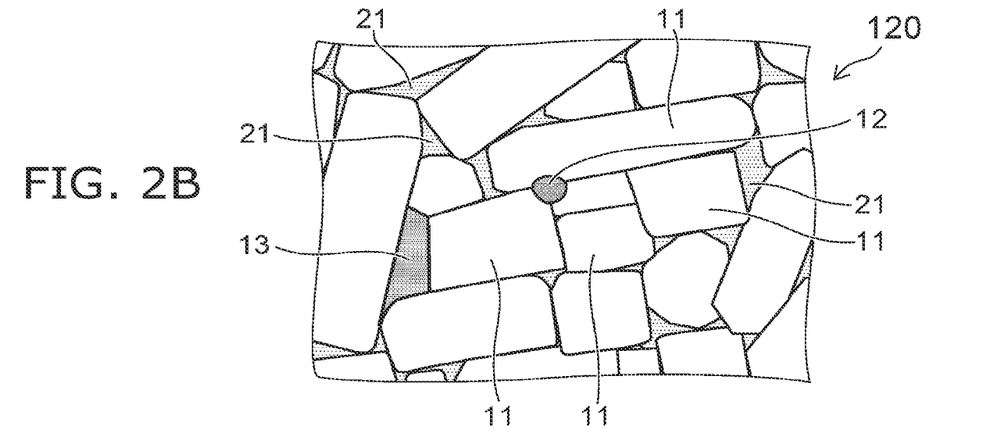

A structure 120 illustrated in FIGS. 2A and 2B further includes a third crystal grain 13. The third crystal grain 13 includes a second element selected from the first group and oxygen. For example, the third crystal grain 13 includes a crystal of an oxide of the second element. The second element is different from the first element.

Part of the plurality of the first crystal grains 11 are provided around the third crystal grain 13. Another part of the plurality of the first crystal grains 11 are provided around the second crystal grain 12. For example, the third crystal grain 13 is surrounded by the plurality of the first crystal grains 11. The third crystal grain 13 is positioned between one first crystal grain 11 and another first crystal grain 11. For example, at least a part of the third crystal grain 13 is in contact with the one first crystal grain 11 and the other first crystal grain 11. For example, at least a part of crystal lattices of the third crystal grain 13 conforms to at least a part of crystal lattices of the one first crystal grain 11 and at least a part of crystal lattices of the other first crystal grain 11. The third crystal grain 13 is spaced from the second crystal grain 12, for example.

A shape of the third crystal grain 13 may vary depending on the cross-sections, as illustrated in FIGS. 2A and 2B. The shape of the third crystal grain 13 may be arbitrary, like circular, elliptical, substantially square, substantially triangular, or the like.

Including the second crystal grain 12 and the third crystal grain 13 in the structure 120 can improve thermal shock resistance of the structure 120. With this, reliability of the structure 120 can be improved.

Figure 3A:
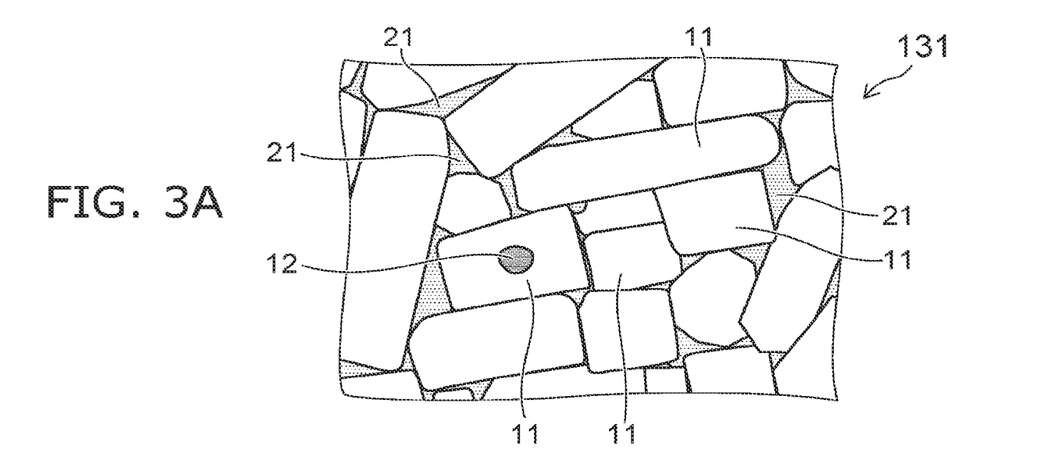
FIGS. 3A and 3B are schematic cross-sectional views illustrating another structure according to the embodiment.
Figure 3B:
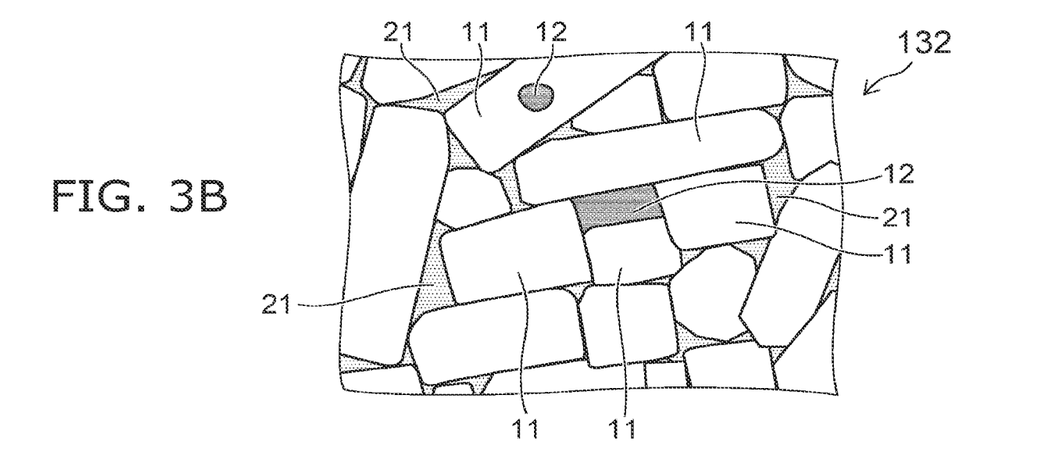

In a structure 131 illustrated in FIG. 3A, the second crystal grain 12 is provided in one first crystal grain 11. A structure 132 illustrated in FIG. 3B includes a plurality of the second crystal grains 12. One of the plurality of the second crystal grains 12 is surrounded by the plurality of the first crystal grains 11. Another one of the plurality of the second crystal grains 12 is provided in one first crystal grain 11. The first crystal grain 11 in which the second crystal grain 12 is provided may be one of the plurality of the first crystal grains 11 by which another second crystal grain 12 is surrounded.

Figure 4A:
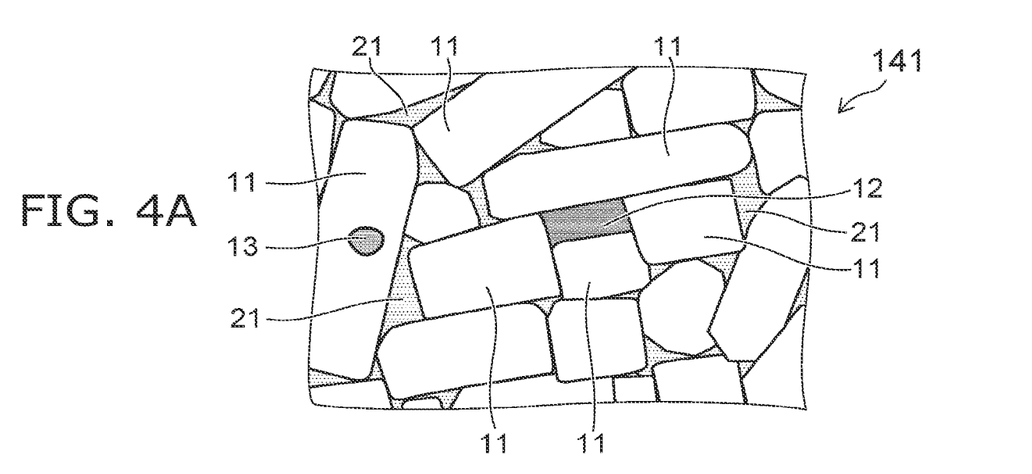
FIGS. 4A and 4B are schematic cross-sectional views illustrating another structure according to the embodiment.

In a structure 141 illustrated in FIG. 4A, the third crystal grain 13 is provided in one first crystal grain 11. For example, the third crystal grain 13 is provided in one of the plurality of the first crystal grains 11. The second crystal grain 12 is surrounded by another two or more of the plurality of the first crystal grains 11.

Figure 4B:
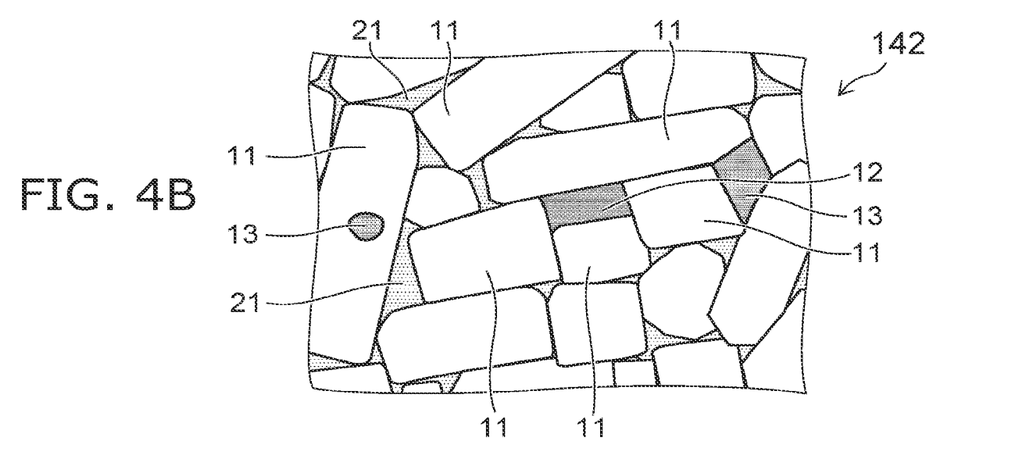

A structure 142 illustrated in FIG. 4B includes a plurality of the third crystal grains 13. Each of the second crystal grain and one of the plurality of the third crystal grains 13 is surrounded by two or more of the plurality of the first crystal grains 11. Another one of the plurality of the third crystal grains 13 is provided in another one of the plurality of the first crystal grains 11.

The first crystal grain 11 in which the third crystal grain 13 is provided may be one of the plurality of the first crystal grains 11 surrounding another third crystal grain 13. The structure 142 may further include another second crystal grain 12 provided in one first crystal grain 11. It is favorable that the third crystal grain 13 is surrounded by the first crystal grains 11 or is in contact with the first crystal grains 11, because the third crystal grain 13 can reduce strain generated in the first crystal grains 11.

A method of manufacturing the structure according to the embodiment will now be described.

Si of 100 mol % expressed in terms of $Si_3N_4$, $Y_2O_3$ of 2 mol %, and MgO of 5 mol % are weighed. $Y_2O_3$ and MgO are used as auxiliary agents. In addition, $B_2O_3$ may be used as the auxiliary agent, and each of these auxiliary agents may be used alone, or a plurality of the auxiliary agents may be mixed and used. A percentage of the auxiliary agent is favorably not lower than 2 mol % and not higher than 20 mol % expressed in terms of $Si_3N_4$. These materials are ground and mixed by using a planetary ball mill for not shorter than 0.5 hours and not longer than 10 hours. When the grinding time is too short, grain diameters of the materials are too large, and the strength of the structure decreases, which is not favorable. When the grinding time is too long, the materials are oxidized, and the thermal conductivity decreases, which is not favorable.

Next, granulation is performed by drying the mixture, and adding a binder. At this time, polyvinyl butyral, polyvinyl alcohol, ethyl cellulose, and the like may be used as the binder. These binders may be used alone or a plurality of different binders may be mixed. Not less than 2 wt % and not more than 20 wt % of the binder with respect to the mixture is favorably added. When the binder is less than 2 wt %, the materials are hardly bound to each other, and the strength of the structure decreases, which is not favorable. When the binder is more than 20 wt %, an amount of the binder in the structure becomes too large, and a density of the structure decreases, which is not favorable.

Thereafter, by applying a pressure of not lower than 0.3 t/cm$^2$ and not higher than 3 t/cm$^2$, molding is performed. The pressure is adjusted depending on the materials. When the pressure is too low, the binding becomes weak, and a molded body easily collapses, which is not favorable. When the pressure is too high, the molded body may be broken, which is not favorable.

The molded body is degreased in air at a temperature of not lower than 400° C. and not higher than 700° C., and then is processed in a nitrogen atmosphere at not lower than 1200° C. and not higher than 1400° C. When the degreasing temperature is too low, the binder component remains, which is not favorable. When the degreasing temperature is too high, the raw materials are oxidized, which is not favorable. In addition, when the heat treatment temperature of the nitriding is too low, reaction does not easily occur, which is not favorable. When the heat treatment temperature is too high, Si melts before the nitriding, which is not favorable. The processing time for the degreasing and the nitriding (*) is adjusted depending on the processing temperature.

Thereafter, the structure according to the embodiment may be obtained by sintering for not shorter than 1 hour and not longer than 96 hours at a temperature of not lower than 1600° C. and not higher than 2000° C. When the sintering temperature is too low, the structure is not densified, which is not favorable. When the sintering temperature is too high, grain growth becomes excessive. As a result, the strength decreases and composition deviation due to volatilization of Si occurs, which is not favorable. The similar things occur for the sintering time.

An example of the method of manufacturing the structure according to the embodiment will be described in detail. Si of 100 mol % expressed in terms of $Si_3N_4$, $Y_2O_3$ of 2 mol %, and MgO of 5 mol % are weighed. $Y_2O_3$ and MgO are used as auxiliary agents. These materials are ground and mixed for 1 hour by using a planetary ball mill. The granulation is performed by drying the mixture and adding 5 wt % of polyvinyl butyral as a binder. Then, by applying a pressure of 1 t/cm$^2$, molding is performed. The molded body is degreased in air at 500° C., and then is processed in a nitrogen atmosphere for 8 hours at 1400° C. Thereafter, the structure according to the embodiment may be obtained by sintering at 1900° C. for 24 hours.

In a method of manufacturing a structure according to a comparative example, Si of 100 mol % expressed in terms of $Si_3N_4$, $Y_2O_3$ of 2 mol %, and MgO of 5 mol % are weighed. $Y_2O_3$ and MgO are used as auxiliary agents. These materials are ground and mixed for 1 hour by using the planetary ball mill. Powder obtained by drying the mixture is molded by applying a pressure of 3 t/cm$^2$ by hydrostatic press. Thereafter, the mixture is processed in a nitrogen atmosphere for 8 hours at 1400° C. Thereafter, the structure according to the comparative example may be obtained by sintering at 1900° C. for 24 hours.

For the obtained structure, an oxygen concentration in the first crystal grain 11 and a volume percentage of the second crystal grain 12 were measured. In the example, the second crystal grain 12 includes a crystal of $Y_2O_3$. As a result of the measurement, in the structure according to the embodiment, the volume percentage of the second crystal grain 12 was 0.003 vol %. The oxygen concentration in the first crystal grain 11 was 0.015 wt %. As a result of evaluating the thermal conductivity of the obtained structure, the thermal conductivity was 105 W/(mK).

No crystal of $Y_2O_3$ was observed in the structure according to the comparative example. Therefore, in the comparative example, the volume percentage of the second crystal grain 12 was 0 vol %. In the comparative example, the oxygen concentration in the first crystal grain 11 was 0.01 wt %, and the thermal conductivity was 110 W/(mK).

Furthermore, when evaluation of a three-point flexural strength (JIS-R-1601 (2008)) was performed, the flexural strength of the structure according to the embodiment was 711 MPa. In addition, a thermal shock test was performed in the following manner. The test was repeated 10 times in which a test piece heated to 1000° C. by an electric furnace was put into water. Then, the three-point flexural test described above was performed, and the flexural strength of the structure according to the embodiment was 723 MPa. This value is approximately equivalent to a value measured before the thermal shock test.

In contrast, the three-point flexural strength of the structure according to the comparative example was 705 MPa. In addition, when the three-point flexural test was performed after performing the thermal shock test in a similar manner, the flexural strength of the structure according to the comparative example was reduced to 598 MPa.

A method for measuring a volume of the second crystal grain 12 in the structure is as follows.

A transmission electron microscope (TEM) is used to obtain an image of a part of the cross-section of the structure. A magnification in observing the structure is arbitrary. For example, the magnification is favorably not smaller than 20000 times. The second crystal grain 12 is found by mapping analysis using energy dispersive X-ray spectrometry (EDX) or the like. For example, the second crystal grain 12 may be recognized to be a single crystal by an electron diffraction pattern. The electron diffraction pattern of the second crystal grain 12 is information concerning one point, but the second crystal grain 12 is a single phase grain, and therefore may be considered as a single crystal that remains without being dissolved. An area occupied by the second crystal grain 12 that is a target in the overall area being observed is calculated. Similar operations are repeated in a plurality of fields of view. The area of the second crystal grain 12 that is the target with respect to the area of the overall structure is determined and averaged, and a volume percentage is obtained by calculating the three-halves power of the average result.

The maximum diameter and the minimum diameter of each first crystal grain 11 may be measured using a TEM. For example, 10 first crystal grains 11 are arbitrarily selected from an observation field of view. The observation field of view is set to 3500 nm×3500 nm, for example. The first crystal grain 11 which is partially invisible at an end of the observation field of view is not a measurement target. The maximum diameter and the minimum diameter of each of the selected 10 first crystal grains 11 are then measured. The first crystal grain 11 with the longest maximum diameter and the first crystal grain 11 with the shortest minimum diameter are excluded from the 10 first crystal grains 11. This leaves eight or nine first crystal grains 11. By using the maximum diameter and the minimum diameter of each of the remaining first crystal grains 11, a ratio of an average of the minimum diameters with respect to an average of the maximum diameters is calculated. When a ratio of the maximum diameter of the second crystal grain 12 with respect to the average of the maximum diameters of the plurality of the first crystal grains is calculated, the average of the maximum diameters of the plurality of the first crystal grains is calculated in a similar manner.

A method for measuring an oxygen concentration in the first crystal grain 11 is as follows.

The obtained structure is ground using a vibration mill. After roughly removing grain boundaries, the grain boundaries and oxidization layers on surfaces are removed using hydrofluoric acid and sulfuric acid. Separation is performed by using 100 # of a sieve after washing with water. A sample obtained by the separation is heated at 2500° C. and released gas is analyzed to determine the oxygen concentration. The method for this measurement is described, for example, in Adv. Mater. 2011, 23, 4563-4567.

Alternatively, EDX may be used to obtain mapping of elements in the second crystal grain 12 and to calculate the oxygen concentration based on the result.

(Variation)

Each structure according to the embodiment described above favorably further includes boron (boron: B). Including boron can provide the structure with higher thermal conductivity and strength, and superior thermal shock resistance. A molar ratio of the content of boron included in the structure with respect to the content of silicon (Si) included in the structure (boron content/silicon content) is not smaller than 0.001 mol % and not larger than 1 mol %. It is considered that in a case where the molar ratio is within this range, when the surface of the first crystal grain 11 is nitrided due to thermal runaway in nitriding, aggregation of silicon may be suppressed even when the silicon melts. As a result, it is considered that agglomeration of silicon is suppressed from being deposited, and nitriding may proceed smoothly.

Additionally, a mol concentration of boron included in the first region 21 is larger than any of a mol concentration of boron included in the first crystal grain 11, a mol concentration of boron included in the second crystal grain 12, and a mol concentration of boron in the third crystal grain 13. The mol concentration of boron included in the first region 21 is larger than the mol concentration of boron included in each of the first crystal grain 11 and second crystal grain 12, so that the nitriding reaction may proceed smoothly, which is favorable.

Also, the mol concentration of boron mol included in the first region 21 is larger than the mol concentration of boron included in the third crystal grain 13. Preferably, the first region 21 includes boron. For example, the first region 21 includes an oxide of boron. For example, a molar ratio of the number of moles of boron included in the first region 21 with respect to the number of moles of silicon included in the first crystal grain 11 (the number of moles of boron included in the first region 21/the number of moles of silicon included in the first crystal grain 11) is not small than 0.001 mol % and not larger than 1 mol %. Favorably, the molar ratio of the number of moles of boron included in the first region 21 with respect to the number of moles of silicon included in the first crystal grain 11 is not smaller than 0.005 mol % and not larger than 0.5 mol %. Preferably, the molar ratio of the number of moles of boron included in the first region 21 with respect to the number of moles of silicon included in the first crystal grain 11 is not smaller than 0.01 mol % and not larger than 0.5 mol %. In a case where the molar ratio is within this range, aggregation of silicon may be suppressed even when silicon melts due to thermal runaway in nitriding, which is preferable because aggregation of silicon is suppressed from being deposited, and nitriding may be further promoted smoothly.

A method of manufacturing according to the variation is similar to the method described above except that a boron compound is added. Not less than 0.001 mol % and not more than 1 mol % of the boron compound is favorably added to Si. Within this range, agglomeration of silicon is suppressed from being deposited, and nitriding may proceed smoothly.

A specific example of a method of manufacturing the structure according to the variation will be described.

Si of 100 mol % expressed in terms of $Si_3N_4$, $Y_2O_3$ of 2 mol %, and MgO of 5 mol % are weighed. At this time, 0.1 mol % of $B_2O_3$ was added to Si. Subsequent processing was performed in the similar manner to the method of manufacturing the structure according to the embodiment. For the fabricated structure, a volume percentage of a $Y_2O_3$ crystal grain in the first crystal grain 11 was 0.005 vol %. An oxygen concentration in the first crystal grain 11 was 0.013 wt %. A thermal conductivity of the fabricated structure was 111 W/(mK).

As a result of fabricating the structure by the method of manufacturing described above, it was found that deposition of silicon in the structure may be suppressed. The suppression of silicon deposition can improve thermal shock resistance, thermal conductivity, or flexural strength of the structure.

A sintered body of silicon nitride is considered to be formed of silicon because of the following reason.

When a molded body is heated in a nitrogen atmosphere, nitrided silicon (for example, $Si_3N_4$) is formed. Thereafter, the oxide of the element selected from the first group forms a liquid phase. The nitrided silicon (for example, $Si_3N_4$) is wrapped by the liquid phase. The liquid phase dissolves silicon nitride such as flux. As a result, constituent atoms of the silicon nitride easily move, and growth of a silicon nitride grain is facilitated. Thus, the oxide is also referred to as a sintering auxiliary agent. The liquid phase is rapidly cooled in a cooling process after completion of sintering, so that the liquid phase becomes an amorphous phase without crystallization.

The inventors found that by terminating the nitriding before the sintering auxiliary agent completely becomes the liquid phase and by performing the sintering, a part of auxiliary agent is incorporated into the silicon grain in a solid state. The incorporated auxiliary agent remains crystalline without forming a eutectic with other auxiliary agents. As a result, oxygen of a raw material silicon grain may be suppressed from remaining in the silicon nitride grain.

Furthermore, the nitriding is facilitated by the structure including boron (especially $B_2O_3$). This is considered because an oxide layer on a surface of the silicon grain and boron oxide form the eutectic at a low temperature (for example, not higher than 1000° C.) to become the liquid phase, so that the nitriding proceeds at the low temperature. When the surface of the silicon grain is nitrided to some extent, the silicon does not aggregate even when the silicon melts. As a result, deposition of silicon can be suppressed.

Figure 5A:
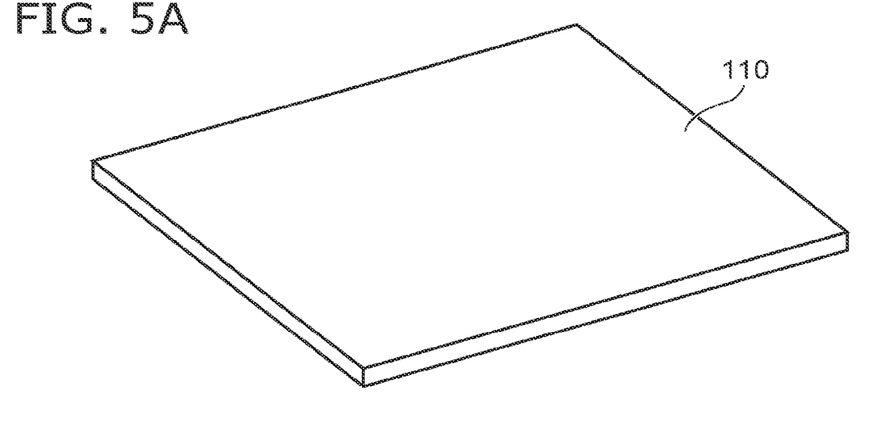
FIGS. 5A and 5B are schematic perspective views illustrating the structure according to the embodiment.
Figure 5B:
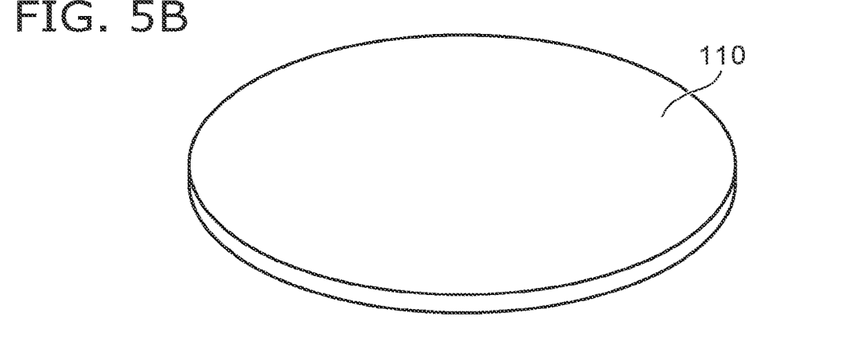

FIG. 5 is a perspective view illustrating the structure according to the embodiment.

For example, as illustrated in FIGS. 5A and 5B, the structure according to the embodiment is a substrate. A shape of the substrate is arbitrary. One cross-section of the substrate includes the structure illustrated in any one of FIGS. 1A to 1C, FIGS. 2A to 2B, FIGS. 3A to 3B, FIG. 4A and FIG. 4B. Alternatively, the structure according to the embodiment may be a bearing or the like.

Figure 6:
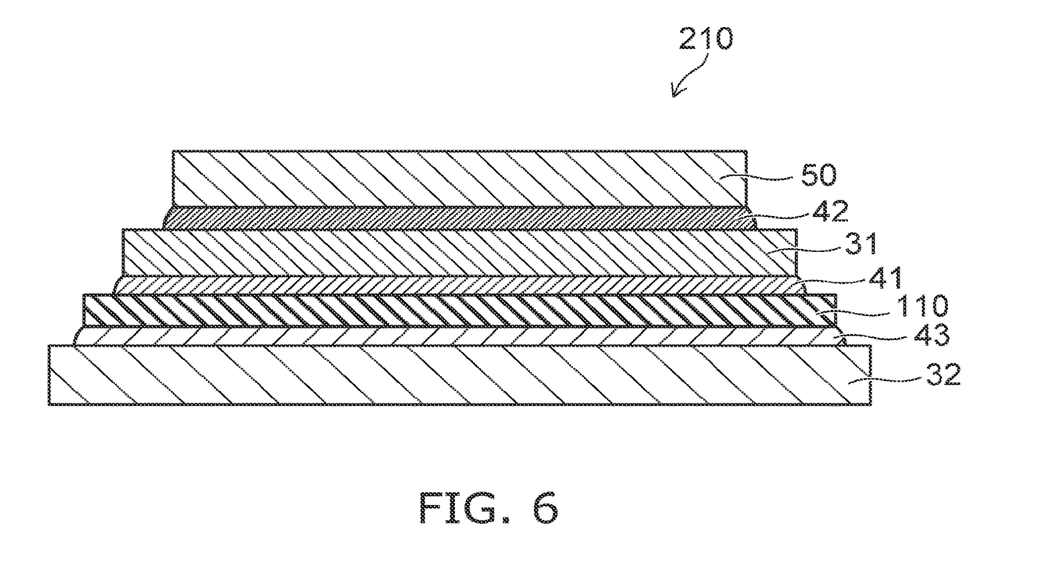
FIG. 6 is a schematic cross sectional view illustrating a circuit board according to the embodiment.

FIG. 6 is a schematic cross-sectional view illustrating a circuit board according to the embodiment.

A circuit board 210 according to the embodiment includes a first metal part 31 and the structure 110, as illustrated in FIG. 6. The structure illustrated in FIG. 2A, FIG. 2B, FIG. 3A, FIG. 3B, FIG. 4A, or FIG. 4B may be provided instead of the structure 110. In this example, the structure 110 is used as a substrate.

The first metal part 31 is bonded to the structure 110. For example, a bonding part 41 is provided between the first metal part 31 and the structure 110. The first metal part 31 may be directly bonded to the structure 110 without the bonding part 41 interposed between the first metal part 31 and the structure 110.

In the example illustrated in FIG. 6, the circuit board 210 further includes a second metal part 32 and a semiconductor device 50. The semiconductor device 50 is bonded to the first metal part 31. The first metal part 31 is positioned between the structure 110 and the semiconductor device 50. For example, a bonding part 42 is provided between the semiconductor device 50 and the first metal part 31. The semiconductor device 50 may be directly bonded to the first metal part 31 without the bonding part 42 interposed between the semiconductor device 50 and the first metal part 31.

The second metal part 32 is bonded to the structure 110. The structure 110 is positioned between the first metal part 31 and the second metal part 32. For example, a bonding part 43 is provided between the second metal part 32 and the structure 110. The second metal part 32 may be directly bonded to the structure 110 without the bonding part 43 interposed between the second metal part 32 and the structure 110. The second metal part 32 functions as a heat sink, for example.

The first metal part 31 and the second metal part 32 include at least one selected from the group consisting of copper, aluminum, and silver, for example. The bonding parts 41 to 43 include at least one selected from the group consisting of silver and copper, for example. The bonding parts 41 to 43 may further include at least one selected from the group consisting of titanium, hafnium, zirconium, niobium, indium, tin, and carbon. The semiconductor device 50 includes, for example, a diode, a MOSFET, or an IGBT.

The use of the structure 110 can improve heat shock resistance of the circuit board 210. As a result, reliability of the circuit board 210 can be improved.

According to each embodiment described above, a structure and a circuit board can be provided that can improve heat resistance.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in structures and circuit boards such as first crystal grains, second crystal grains, third crystal grains, first regions, metal parts, bonding parts, semiconductor elements, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all structures, and circuit boards practicable by an appropriate design modification by one skilled in the art based on the structures, and the circuit boards described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A structure comprising:
a first crystal grain including silicon nitride;
a second crystal grain including a first element selected from a first group consisting of scandium, yttrium, lanthanum, cerium, praseodymium, neodymium, promethium, samarium, europium, gadolinium, terbium, dysprosium, holmium, erbium, thulium, ytterbium, lutetium, aluminum, chromium, zirconium, magnesium, zinc, titanium, gallium, beryllium, calcium, strontium, barium, hafnium, vanadium, niobium, tantalum, tungsten, iron, cobalt, nickel, and copper, and oxygen, the second crystal grain being of a single crystal; and
a first region including an oxide of the first element.

2. The structure according to claim 1, wherein
the second crystal grain is provided in the first crystal grain.

3. The structure according to claim 1, wherein
a plurality of the first crystal grains are provided, and
the first crystal grains are provided around the second crystal grain.

4. The structure according to claim 1, wherein
a plurality of the first crystal grains and a plurality of the second crystal grains are provided,
part of the first crystal grains are provided around one of the second crystal grains, and
another one of the second crystal grains is provided in another one of the first crystal grains.

5. The structure according to claim 1, wherein
a plurality of the first crystal grains are provided,
the second crystal grain is positioned between one of the first crystal grains and another one of the first crystal grains, and
at least a part of the second crystal grain contacts at least one of the one of the first crystal grains and the other one of the first crystal grains.

6. The structure according to claim 1, wherein
a plurality of the first crystal grains and a plurality of the second crystal grains are provided,
one of the second crystal grains is positioned between one of the first crystal grains and another one of the first crystal grains,
the one of the second crystal grains contacts at least one of the one of the first crystal grain and the other one of the first crystal grains, and
another one of the second crystal grains is provided in still another one of the first crystal grains.

7. The structure according to claim 1, the structure further comprising:
a third crystal grain including a second element selected from the first group and oxygen, wherein
the second element is different from the first element.

8. The structure according to claim 7, wherein
a plurality of the first crystal grains are provided, the second crystal grain is surrounded by a part of the first crystal grains, and the third crystal grain is surrounded by another part of the first crystal grains.

9. The structure according to claim 8, wherein
the second crystal grain contacts at least one of the part of the first crystal grains, and
the third crystal grain contacts at least one of the other part of the first crystal grains.

10. The structure according to claim 7, wherein
the third crystal grain is provided inside the first crystal grain.

11. The structure according to claim 1, wherein
an oxygen concentration in the first crystal grain is higher than 0 wt % and not higher than 0.1 wt %.

12. The structure according to claim 1, wherein
a volume ratio of the second crystal grain is not smaller than 0.0001 vol % and not larger than 5 vol %.

13. The structure according to claim 1, wherein
the first region includes boron.

14. The structure according to claim 13, wherein
a molar ratio of a number of moles of boron included in the first region with respect to a number of moles of silicon included in the first crystal grain is not smaller than 0.001 and not larger than 1.

15. The structure according to claim 3, wherein
a ratio of an average of minimum diameters of the first crystal grains with respect to an average of maximum diameters of the first crystal grains is larger than 0 and not larger than 0.1.

16. The structure according to claim 3, wherein
a ratio of a maximum diameter of the second crystal grain with respect to an average of maximum diameters of the first crystal grains is not smaller than 0.001 and not larger than 0.5.

17. The structure according to claim 1, wherein
a molar ratio of content of the boron with respect to content of the silicon is not smaller than 0.001 and not larger than 1.

18. The structure according to claim 1, wherein
a mol concentration of boron included in the first region is larger than a mol concentration of boron included in the first crystal grain and is larger than a mol concentration of boron included in the second crystal grain.

19. A circuit board comprising:
the structure according to claim 1; and
a first metal part bonded to the structure.

20. The circuit board according to claim 19, the circuit board further comprising:
a semiconductor device bonded to the first metal part, wherein
the first metal part is positioned between the structure and the semiconductor device.

21. The structure according to claim 1, wherein
the first element is yttrium or magnesium.

22. The structure according to claim 1, wherein
the single crystal consists of the first element and oxygen.

\* \* \* \* \*